United States Patent
Saggio et al.

(10) Patent No.: US 6,709,955 B2
(45) Date of Patent: Mar. 23, 2004

(54) METHOD OF FABRICATING ELECTRONIC DEVICES INTEGRATED IN SEMICONDUCTOR SUBSTRATES PROVIDED WITH GETTERING SITES, AND A DEVICE FABRICATED BY THE METHOD

(75) Inventors: Mario Saggio, Aci Castello (IT); Vito Raineri, Mascalucia (IT); Umberto Stagnitti, Castiglione Di Sicilia (IT); Sebastiano Mugavero, Messina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 55 days.

(21) Appl. No.: 09/842,841

(22) Filed: Apr. 27, 2001

(65) Prior Publication Data

US 2002/0001923 A1 Jan. 3, 2002

Related U.S. Application Data

(63) Continuation-in-part of application No. 09/549,889, filed on Apr. 17, 2000, now Pat. No. 6,451,672.

(30) Foreign Application Priority Data

Apr. 28, 2000 (IT) ..................................... MI2000A0941

(51) Int. Cl.[7] ........................................... H01L 21/322
(52) U.S. Cl. ..................... 438/473; 438/471; 257/913
(58) Field of Search ................................. 438/473, 471, 438/660, 474, 476, 477, 449, 450, 451; 257/913

(56) References Cited

U.S. PATENT DOCUMENTS

| 4,371,403 | A | * | 2/1983 | Ikubo et al. ................. 148/1.5 |
| 5,244,819 | A | * | 9/1993 | Yue ............................. 438/460 |
| 5,714,395 | A | | 2/1998 | Bruel ........................... 437/24 |
| 5,840,590 | A | | 11/1998 | Myers, Jr. et al. ............. 437/11 |
| 6,103,582 | A | * | 8/2000 | Lee et al. ..................... 438/299 |
| 6,162,705 | A | | 12/2000 | Henley et al. ................. 438/478 |
| 6,168,981 | B1 | | 1/2001 | Battaglia et al. .............. 438/164 |
| 6,225,192 | B1 | * | 5/2001 | Aspar et al. .................. 438/460 |
| 6,228,694 | B1 | * | 5/2001 | Doyle et al. .................. 438/199 |

FOREIGN PATENT DOCUMENTS

| JP | 05235005 | 9/1993 |
| JP | 10032209 | 2/1998 |
| JP | 11074275 | 3/1999 |

OTHER PUBLICATIONS

Raineri et al., "Gettering of Metals by Voids in Silicon," *Journal of Applied Physics*, 78(6):3727–3735, Sep. 15, 1995.

Petersen et al., "Gettering of Transition Metals by Cavities in Silicon Formed by Helium Ion Implantation," *Nuclear Instruments and Methods in Physics Research*, Section B, 127–128:302–306, May 1, 1997.

Zhangn et al., "Gettering of Cu by Microcavities in Bonded/Ion–Cut Silicon–on–Insulator and Separation by Implantation of Oxygen," *Journal of Applied Physics*, 86(8):4214–4219, Oct. 15, 1999.

* cited by examiner

*Primary Examiner*—Caridad Everhart
(74) *Attorney, Agent, or Firm*—Lisa K. Jorgenson; Robert Iannucci; Seed IP Law Group PLLC

(57) ABSTRACT

A method of fabricating electronic devices, integrated monolithically in a semiconductor substrate having at least one non-active area contiguous with at least one device active area, which method comprises at least one step of implanting ions of a noble gas, followed by a thermal treatment to form getter microcavities in the semiconductor by evaporation of the noble gas, wherein the implanting step is carried out in the non-active area of the semiconductor.

11 Claims, 1 Drawing Sheet

METHOD OF FABRICATING ELECTRONIC DEVICES INTEGRATED IN SEMICONDUCTOR SUBSTRATES PROVIDED WITH GETTERING SITES, AND A DEVICE FABRICATED BY THE METHOD

CROSS-REFERENCE TO RELATED APPLICATION

This is a continuation-in-part of U.S. patent application Ser. No. 09/549,889 filed on Apr. 17, 2000, now U.S. Pat. No. 6,451,672 and entitled METHOD FOR MANUFACTURING ELECTRONIC DEVICES IN SEMICONDUCTOR SUBSTRATES PROVIDED WITH GETTERING SITES.

TECHNICAL FIELD

The present invention relates to a method of fabricating electronic devices, integrated in semiconductor substrates provided with gettering sites, and a device fabricated by this method.

Specifically, the invention relates to a method of fabricating electronic devices, integrated monolithically in a semiconductor substrate having at least one non-active area contiguous with at least one active area of the device, the method comprising at least one step of implanting ions of a noble gas, followed by a thermal treatment to form getter microcavities in said semiconductor by evaporation of said noble gas.

The invention further relates to an electronic device integrated in a semiconductor substrate having at least one non-active area contiguous with at least one active area of said device.

The invention relates, particularly but not exclusively, to a method as above, which comprises at least one step of implanting ions of a noble gas, followed by a thermal treatment that leads to the formation of getter bubbles in said semiconductor by evaporation of said noble gas. The ensuing description is referred to this field of application for convenience of explanation only.

BACKGROUND OF THE INVENTION

A requisite of this specific technical field is that metal contaminants, as are to be found normally in semiconductor substrates and may seriously affect the performance of integrated circuits in the substrates, be trapped out.

The presence of metal impurities in the lattice structure of silicon is, in fact, a constant source of problems and malfunction with semiconductor electronic devices. Thus it is that intensive research work is being carried out to rid the silicon of such metal impurities.

To address the problem, gettering techniques have been adopted, whereby semiconductor monolithically integrated electronic devices are provided with getters effective to trap out metal contaminants present in the semiconductor.

These getters are usually formed at the end of the integrated circuit fabricating process. For the purpose, the front side of the semiconductor wafer, where the circuits have been formed, is covered with a protective layer, and the back side of the wafer is cleaned and applied a POC13 deposition or phosphorus (P) ion implantation directed to create certain extensively damaged or defective areas in the semiconductor substrate.

These areas act as getters effective to attract and segregate metal atomic impurities, as explained hereinafter.

However, this prior gettering technique poses some problems due to that it is applied practically at the end of the fabrication process and may affect the performance of the circuits that have been formed in the semiconductor wafer. Also, because of the low solid-state solubility of phosphorus in silicon, the gettering efficiency of defects so created is not particularly high.

SUMMARY OF THE INVENTION

An embodiment of this invention provides a method of fabricating devices with getters, which method has suitable features to enhance the trapping of metal atomic impurities without altering the device current flows, thus overcoming the drawbacks with which prior devices are beset.

The method enhances trapping of the impurities without altering the device current flows by having gettering sites produced and confined within non-active areas of electronic devices formed on a semiconductor.

z

The features and advantages of the device according to the invention will be apparent from the following description of an embodiment thereof, given by way of non-limitative example with reference to the accompanying drawings.

DETAILED DESCRIPTION OF THE INVENTION

Figure 1:
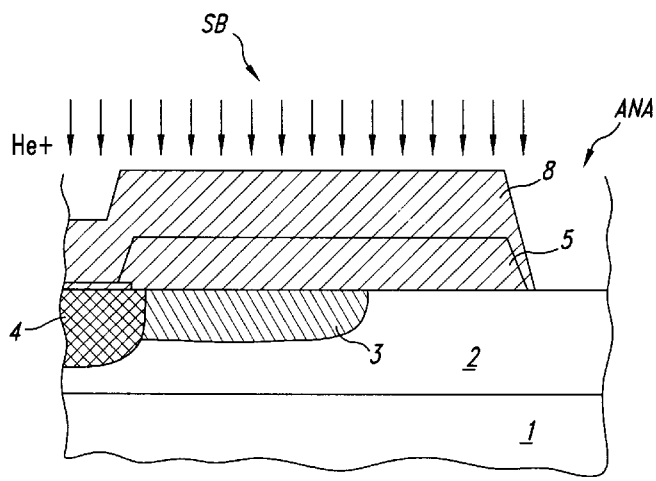
FIG. 1 shows, schematically and to an enlarged scale, a vertical cross-section through a portion of a semiconductor substrate at one stage of the inventive method.
Figure 2:
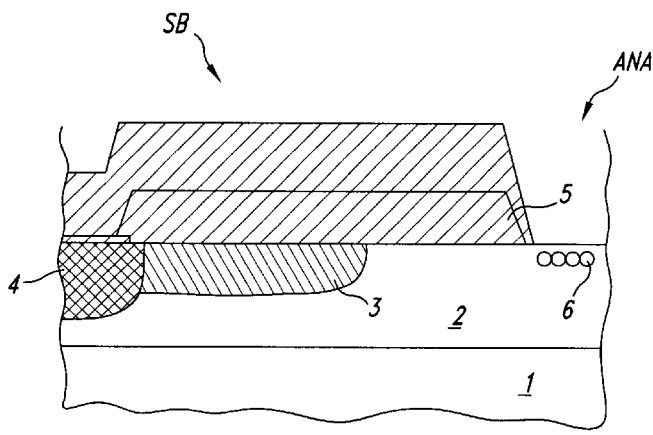
FIG. 2 shows schematically the substrate portion of FIG. 1 at a later stage of the inventive method.
Figure 3:
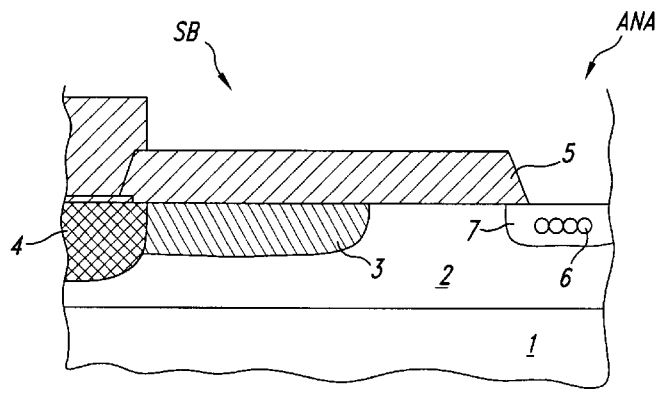
FIG. 3 shows schematically the substrate portion of FIG. 2 at a final stage of the inventive method.

One way to produce microcavities is to subject the semiconductor wafer to an implantation of light ions of a noble gas such as helium (He). This method is disclosed in the parent application U.S. application Ser. No. 09/549,889 which is incorporated herein by reference in its entirety. These ions are highly permeable into silicon, and are implanted at a high concentration ($>5 \times 10^{15}$ atoms/cm$^2$) and low energy, so as to generate gas bubbles within the crystalline structure.

The energy level at which the implantation is performed is not particularly critical to a successful implantation: a few keV or tens of MeV may be used. However, the minimum dosage for bubble formation will grow with the implantation energy.

At low energies, bursts can make their appearance in the semiconductor surface, whilst at high energies, the implanting dosages need to be so high that the process ceases to be cost-efficient.

The implantation is followed by a thermal treatment, to be carried out at temperatures above 700° C., whereby the gas is diffused through the crystalline structure as far as the semiconductor surface, whence it is exhaled.

The exhaled gas leaves behind microcavities in the crystalline structure, the average size of such microcavities increasing with the processing temperature. Further, these microcavities locate and are confined within the projection regions of the implanted ions.

It has been observed that these microcavities constitute an energetically stable defect in silicon. In other words, they will not evolve into crystallographic defects of a different nature, even in consequence of the thermal treatments that are to be applied after the bubble-forming step.

Silicon atoms having unsaturated bonds exist at the surfaces of the microcavities formed as just described, and are strongly reactive to impurities, especially impurities of metals, such as copper (Cu), platinum (Pt), or iron (Fe).

Although achieving its objective, this solution also has a drawback in an inferior trapping efficiency of the microcavities, the latter emerging from the electronic device fabrication process in a crowded state to the device bottom. Furthermore, the process is not stable to temperature variation.

With reference to the drawing views, there is shown a substrate of a semiconductor material, such as monocrystalline silicon, being processed through a sequence of steps according to the method of this invention.

The process steps and the structures described hereinafter are not exhaustive of a process for fabricating integrated circuits. In fact, this invention can be practiced in combination with currently employed techniques for fabricating integrated circuits, and only such commonly used steps of the fabrication process as are necessary to an understanding of this invention will be described.

The drawing cross-sectional views of a semiconductor substrate under fabrication are not drawn to scale, but rather to emphasize major features of the invention.

A method of fabricating electronic devices, integrated in a semiconductor substrate and formed with gettering sites, will now be described with reference to the drawing views.

The expression "gettering sites" is used here to indicate semiconductor areas where microcavities have been formed that can attract and segregate metal atomic impurities present in the semiconductor.

With reference to the drawing views, an epitaxial layer 2, e.g., of the N⁻ type, is grown on the surface of a substrate 1, e.g., of the N⁺ type. A first region 3, e.g., of the P type, is diffused in the epitaxial layer 2. A second region 4, e.g., of the P⁺ type, is diffused in the region 3.

Alternatively, the second region 4 could be formed before the first 3. The first and second regions 3, 4 form an active area of the epitaxial layer 2.

A dielectric layer 5, e.g., silicon oxide, is then formed over the surface of the epitaxial layer 2 to cover both the first and second regions, 3 and 4, and at least a portion of the epitaxial layer 2 lying adjacent to the first region 3.

The above integrated structure may be, for example, an edge structure SB of an electronic power device, the latter also being formed in the epitaxial layer 2.

Advantageously in this invention, a resist layer 8 is provided on the edge structure to define at least one area of the semiconductor, ANA, referred to as a non-active area.

"Non-active areas" is used here to indicate those portions of the semiconductor substrate where no electric field would be present in operation of the electronic devices integrated in the semiconductor.

Additionally to this substrate portion adjacent to the edge structures SB, all those heavily doped areas of the semiconductor substrate where the electric field would produce no depletion—so that no current is there to generate electric charge carriers—are regarded as non-active (ANA).

Advantageously in this invention, the non-active area ANA is subjected to ion implantation using ions of a noble gas such as helium (He).

This implantation is carried out at a fairly large, preferably larger than $1 \times 10^{16}$ atoms/cm², implant dosage.

The implant energy used at this stage is approximately 20 keV, preferably higher than that.

This implantation represents a first step toward forming microcavities within the epitaxial layer 2.

The inventive method comprises a subsequent thermal treatment, to be applied at a temperature that may be regarded as medium for this kind of electronic component manufacturing processes.

More particularly, the thermal treatment is applied at a temperature in the 600° to 800° C. range. Preferably, the treatment temperature is higher than 700° C., and is maintained for about one hour in an inert atmosphere of nitrogen ($N_2$).

This step of the inventive method allows the helium ions implanted in the layer 2 to form bubbles within the crystalline structure of the semiconductor. As the thermal treatment goes on, the helium gas evaporates from the layer 2, leaving in the substrate an almost uninterrupted series of cavities 6 of a diameter between 10 and 100 nanometers (nm).

Advantageously, a step of implanting a dopant species is carried out at the cavities 6 to produce the doped region 7.

This step may coincide with that of forming conduction regions of the electronic devices.

Summarizing, a device according to an embodiment of this invention exhibits a uniquely high gettering efficiency. In fact, the cavities 6 locate in non-active areas that are contiguous with the regions, referred to as the active areas, where the electronic devices are formed. Thus, a more effective metal contaminant trapping action is fostered at the getters formed in the semiconductor than with prior solutions, wherein cavities are only provided in the lower surface of the semiconductor.

Advantageously, the cavities are created in heavily doped areas, and ensure a fairly low leakage of current.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

We claim:

1. A method of fabricating electronic devices, integrated monolithically in a semiconductor substrate having a non-active area contiguous with a device active area, the method comprising:

implanting ions of a noble gas in said non-active area of said semiconductor substrate;

thermally treating the substrate, following the implanting step, to form getter microcavities in said non-active area by evaporation of said noble gas ions; and implanting a dopant species in said non-active area following said noble gas ion implanting step.

2. A method according to claim 1, wherein an implant dosage for said noble gas ion implanting step is larger than $1 \times 10^{16}$ atoms/cm².

3. A method according to claim 1, wherein an implant energy for said noble gas ion implanting step is equal to or higher than 20 keV.

4. A method according to claim 1, wherein the thermal treatment is applied at a temperature above 700° C., maintained for about one hour in an inert atmosphere.

5. A method according to claim 1 wherein the step of implanting a dopant species in the non-active area forms a first doped region in the non-active area, the method further comprising:

implanting a dopant species in said active area to form a second doped region;

forming a dielectric layer on the second doped region, the dielectric layer extending beyond the second doped region to cover a portion of said non-active area, wherein the portion of said non-active area covered by the dielectric layer spaces the first doped region apart from the second doped region.

6. A method according to claim 1 further comprising:

trapping metallic impurities with the getter microcavities.

7. A method according to claim 1 further comprising:

trapping at least one of copper, platinum, and iron with the getter microcavities.

8. An electronic device, comprising a semiconductor substrate having a non-active area and an active area contiguous with each other, the non-active area including getter microcavities formed by implantation of noble gas ions followed by thermal treatment to evaporate said gas, wherein said non-active area includes a heavily doped implanted region.

9. The device of claim 8, further comprising a dielectric layer that covers a doped region of the active area and a portion of the non-active area that spaces the heavily doped implanted region apart from the doped region of the active area.

10. The device of claim 8, further comprising metallic impurities trapped in the getter microcavities.

11. The device of claim 8, further comprising at least one of copper, platinum, and iron trapped in the getter microcavities.

* * * * *